United States Patent
Hozoi et al.

(10) Patent No.: US 9,646,748 B2
(45) Date of Patent: May 9, 2017

(54) RESISTIVE VOLTAGE DIVIDER MADE OF A RESISTIVE FILM MATERIAL ON AN INSULATING SUBSTRATE

(71) Applicant: ABB AG, Mannheim (DE)

(72) Inventors: Adrian Hozoi, Mannheim (DE); Rolf Disselnkötter, Mauer (DE)

(73) Assignee: ABB AG, Mannheim (DE)

( * ) Notice: Subject to any disclaimer, the term of this patent is extended or adjusted under 35 U.S.C. 154(b) by 535 days.

(21) Appl. No.: 13/974,108

(22) Filed: Aug. 23, 2013

(65) Prior Publication Data
US 2013/0335106 A1 Dec. 19, 2013

Related U.S. Application Data

(63) Continuation of application No. PCT/EP2012/000781, filed on Feb. 23, 2012.

(30) Foreign Application Priority Data

Feb. 25, 2011 (EP) .................................... 11001578

(51) Int. Cl.
*H01C 1/00* (2006.01)
*G01R 27/02* (2006.01)
(Continued)

(52) U.S. Cl.
CPC .............. *H01C 13/02* (2013.01); *G01R 15/04* (2013.01); *G01R 19/0084* (2013.01); *H01C 7/00* (2013.01)

(58) Field of Classification Search
CPC ...... G01R 27/02; G01R 33/09; G01R 33/093; H01C 7/10; H01C 7/12; H01C 7/021;
(Continued)

(56) References Cited

U.S. PATENT DOCUMENTS 5,521,576 A * 5/1996 Collins .................... H01C 3/12
29/620
6,111,494 A 8/2000 Fischer et al.
(Continued)

FOREIGN PATENT DOCUMENTS

| CN | 101577161 A | 11/2009 |
|---|---|---|
| DE | 41 23 249 A1 | 1/1993 |

(Continued)

OTHER PUBLICATIONS

International Search Report (Form PCT/ISA/210) issued on Apr. 26, 2012, by the European Patent Office in the International Application No. PCT/EP2012/000779. (2 pages).
(Continued)

*Primary Examiner* — Patrick Assouad
*Assistant Examiner* — Taqi Nasir
(74) *Attorney, Agent, or Firm* — Taft Stettinius & Hollister LLP (57) ABSTRACT

A resistive voltage divider includes first and second resistors, which are electrically connected in series and are made of a resistive film material which is applied in the form of a trace onto an insulating substrate. The divider's voltage ratio has a value between ten and one million. To improve the accuracy of the voltage divider, the first and second resistors are made of the same resistive film material, have a trace length above a corresponding specific trace length, and have approximately the same trace width.

20 Claims, 6 Drawing Sheets

(51) Int. Cl.
*H01C 13/02* (2006.01)
*G01R 15/04* (2006.01)
*H01C 7/00* (2006.01)
*G01R 19/00* (2006.01)

(58) Field of Classification Search
CPC ........ H01C 17/00; H01C 7/102; H01C 1/142; H01C 7/003; H01C 7/18; H01C 17/006; H01C 1/012; H01C 1/1406; H01C 7/041; H01C 17/281; H01C 1/144
USPC .......... 324/691, 421, 207.21, 525, 549, 727, 324/416, 522
See application file for complete search history.

(56) References Cited

U.S. PATENT DOCUMENTS

| | | | |
|---|---|---|---|
| 6,258,283 B1 | 7/2001 | Mikami et al. | |
| 6,593,697 B1* | 7/2003 | Aarnink | H01J 29/96 315/3 |
| 7,079,004 B2* | 7/2006 | Budak | G01R 15/06 338/195 |
| 7,241,131 B1* | 7/2007 | Booth | B29C 45/2737 219/543 |
| 7,733,212 B2* | 6/2010 | Fricke | H01C 17/065 257/343 |
| 8,581,657 B2* | 11/2013 | Itoh | G05F 1/56 327/525 |
| 2006/0087399 A1* | 4/2006 | Barge | H01C 17/003 338/307 |
| 2013/0342187 A1 | 12/2013 | Hozoi et al. | |
| 2013/0342227 A1 | 12/2013 | Hozoi et al. | |
| 2013/0346004 A1 | 12/2013 | Hozoi et al. | |
| 2014/0043014 A1 | 2/2014 | Ho et al. | |

FOREIGN PATENT DOCUMENTS

| | | |
|---|---|---|
| DE | 195 37 155 A1 | 4/1997 |
| DE | 198 41 164 A1 | 3/2000 |
| EP | 0 536 895 A1 | 4/1993 |
| GB | 735 889 A | 8/1955 |
| GB | 1 539 774 A | 2/1979 |
| WO | WO 01/33602 A1 | 5/2001 |

OTHER PUBLICATIONS

International Search Report (Form PCT/ISA/210) and the Written Opinion of the International Searching Authority (Form PCT/ISA/237) issued on Apr. 27, 2012, by the European Patent Office in the International Application No. PCT/EP2012/000780. (7 pages).
Notification of Transmittal of the International Search Report (Forms PCT/ISA/220 and PCT/ISA/210) and the Written Opinion of the International Searching Authority (Form PCT/ISA/237) issued on Aug. 21, 2012, by the European Patent Office in the International Application No. PCT/EP2012/000818. (10 pages).
International Search Report (PCT/ISA/210) issued on Apr. 27, 2012, by the European Patent Office as the International Searching Authority for International Application No. PCT/EP2012/000781.
Written Opinion (PCT/ISA/237) issued on Apr. 27, 2012, by the European Patent Office as the International Searching Authority for International Application No. PCT/EP2012/000781.

* cited by examiner

RESISTIVE VOLTAGE DIVIDER MADE OF A RESISTIVE FILM MATERIAL ON AN INSULATING SUBSTRATE

RELATED APPLICATIONS

This application claims priority as a continuation application under 35 U.S.C. §120 to PCT/EP2012/000781, which was filed as an International Application on Feb. 23, 2012 designating the U.S., and which claims priority to European Application 11001578.1 filed in Europe on Feb. 25, 2011. The entire contents of these applications are hereby incorporated by reference in their entireties.

FIELD

The present disclosure relates to a resistive voltage divider which includes at least a first resistor and a second resistor electrically connected in series and made of an electrically resistive film material applied in form of a trace onto an insulating substrate.

BACKGROUND INFORMATION

Different techniques are known to manufacture resistors by bringing a non-insulating, electrically resistive film or foil material, such as metal film or metal foil, for example, nickel chromium, cermet film, for example, tantalum nitride, ruthenium dioxide, bismuth ruthenate, carbon film, or a film of composite material based on a mixture of glass and cermet onto an insulating substrate. In rare cases, the electrically resistive film material may consist of multiple, different layers of the above-mentioned materials. The insulating substrate may be ceramic, silicon, glass or some other synthetic material, and the film material is applied to the substrate by methods such as sputtering (thin film), screen and stencil printing (thick film) or direct printing through a nozzle (thick film). The insulating substrate may have the form of a flat planar sheet or of a cylinder, and accordingly the resistive film is deposited either onto a two-dimensional planar surface or onto a three-dimensional axially symmetric surface. In the voltage divider, both the high and low ohmic resistors are brought onto the same substrate. In addition, highly conductive structures with considerable lower resistivity than the film material of the resistors are deposited on the substrate as well. The highly conductive structures are intended to be used as contacting terminals, and they are placed on the substrate in such a way that the resistive film material of the resistors overlaps partly with them.

In order to achieve voltage ratios of significantly more than unity and at the same time reduce the size of the voltage divider, it is known to arrange the resistive film material of the high ohmic resistor in a long and narrow trace, where the trace is shaped like a meandering form. The term meandering form means that the trace is not just a straight line but curved in such a way that a long length is achieved on a small substrate area. The meandering form may look for example like a square wave, a triangle wave, a sine wave, a zigzag or—in the three-dimensional case—a helical form. This is, for example, described in U.S. Pat. No. 5,521,576 for thick film resistors and in U.S. Pat. No. 7,079,004 B2 for thin film AC voltage dividers. As is disclosed there as well, the low resistance value of the low ohmic resistor is commonly obtained by arranging the resistive film material in a short and wide trace.

In general, the above-described resistive voltage dividers can be used for a wide range of voltage levels, from low or medium up to high voltage applications. While the present disclosure originates from the area of medium voltage sensors, such as the KEVCD and KEVA sensor types by ABB, which are commonly applicable to a voltage range between 3.6 kV and 36 kV, the area of application of the present disclosure is not limited to this voltage range.

For most applications, it is desirable that a certain high accuracy of the ratio of the voltage divider can be ensured and that the initial accuracy can be maintained over changing temperature and/or over a long period of time. However, different ageing effects lead to a drift in both the resistance value and the temperature coefficient of the resistors in the divider which results in a gradual deterioration of the accuracy. In U.S. Pat. No. 5,521,576, it is described that for thick film resistors, stable operating characteristics of the resistors can be ensured at a desired value of resistance by printing the resistive composition of the resistive line directly onto the substrate in a continuous pattern, where the resistive line has a length which is at least ten times larger than the width of the line.

The inventors of the present disclosure have realized that for voltage dividers, it is not so much the resistance value of each resistor itself which needs to be stabilized. Instead, it is more important to ensure that the initial resistance values of the resistors are accurate and that the drifting of the operating characteristics of both the high and the low ohmic resistors occurs in the same direction and with possibly the same amount so that the ratio of the resistance values and thereby the divider's voltage ratio is maintained at its initial value over the whole operating temperature range as well as over a long period of time.

SUMMARY

An exemplary embodiment of the present disclosure provides a resistive voltage divider which has a voltage ratio between ten and one million. The exemplary resistive voltage divider includes a first resistor and a second resistor electrically connected in series. The resistors are made of an electrically resistive film material and are each applied in the form of a trace onto an insulating substrate. The first and second resistors are made of the same electrically resistive film material, have a trace length above a corresponding specific trace length and have approximately the same trace width.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Exemplary embodiments of the present disclosure provide a resistive voltage divider which has the features of an improved accuracy and temperature stability as well as long term stability of its voltage ratio. According to an exemplary embodiment, the resistive voltage divider includes at least a first resistor and a second resistor electrically connected in series and made of an electrically resistive film material applied in form of a trace onto an insulating substrate.

Exemplary embodiments of the present disclosure achieve these features by matching the drifting characteristics of the high and low ohmic resistors in the voltage divider as far as possible. A first step for the matching is to use the same electrically resistive film material for all the resistors in the divider. In case of composite materials, this means, for example, to use not only the same kind of composite but the same composite with exactly the same resistivity.

Secondly, it is desirable to understand as many effects as possible which influence either the initial resistance value or the drifting characteristics, and to design the high and low ohmic resistors in such a way that the effects occur in all resistors to possibly the same degree. One important effect is the so-called interface effect, which relates to the electrical interdiffusion which occurs at the interfaces between the contacting terminals and the resistive film material of the resistors. As a result, important parameters like the resistance value per unit length, the temperature coefficient and the long term stability of a resistor vary with the length of its resistive trace, especially when the trace is not much longer than the interdiffusion region. In resistive dividers with a high voltage ratio above ten, the trace length of the high ohmic resistor is significantly longer than the trace length of the low ohmic resistor, which leads to non-negligible mismatch errors of the two resistors and therefore of the voltage ratio. The interface effect has less and less influence on the resistance properties with increasing trace length. The inventors have noted that for commonly used resistive film materials, the interface effect can be neglected above a specific trace length, where the specific trace length may have a value between one and ten millimeters, depending on the particular resistive film material and the manufacturing technology of the resistors. In other words, above the specific trace length, the resistance values and the drift parameters of the high and especially the low ohmic resistors are sufficiently ensured, and thereby a predetermined divider ratio. By choosing appropriate resistive film materials and manufacturing technology, it is possible to keep the specific trace length below convenient values for each particular design. For example, specific trace lengths around two millimeters are possible, thereby allowing for a compact design of the voltage divider.

Another effect which has an impact on the resistance values is the so-called edge effect occurring at the lateral edges of the trace. When looking at the cross section of a typical trace, the lateral edges of the trace are usually not straight and cut sharply, but rather gradually decreasing towards the outer ends. In the edge region of the trace, it is likely that the composition and/or the structure of the electrically resistive film material are slightly altered with respect to the region in the middle of the trace. Accordingly, it can be noted that with decreasing trace width, the edge effect plays a larger role in affecting the trace resistance per unit length as compared to the expected resistance of an ideal trace with a rectangular cross section and homogenous composition and structure. In order to have the same amount of influence of the edge effect on the resistance value of the high and low ohmic resistors, it is therefore advantageous to provide the at least first and second resistors with approximately the same trace width, thereby ensuring superior matching of their resistance values and accordingly improved initial accuracy, temperature stability and long term stability.

In summary, the present disclosure provides that the at least first and second resistors of the voltage divider are made of the same electrically resistive film material, have a trace length above the corresponding specific trace length and have the same trace width.

Further effects which play a role in affecting the resistivity of the resistive film material are related to the fabrication techniques. For example, when the resistors are screen printed using thick film technology, the direction of the mechanical movement of the screen over the insulating surface establishes a certain anisotropic behavior of the resulting trace resistance per unit length, depending on the printing direction. Anisotropic behavior is also unavoidable when thin film technology is used, since the sputtering angle over the substrate area is not perfectly perpendicular and constant but varies slightly. In addition, mechanical stresses which may occur during the fabrication, for example, during packaging and when electrical connections are made to the contacting terminals, as well as during the lifetime of the voltage divider, are often of anisotropic nature. Anisotropic stresses may be more pronounced for three-dimensional, for example, cylindrical, voltage dividers than for two-dimensional, flat voltage dividers. In order to affect the high and low ohmic resistors in the same anisotropic way, an exemplary embodiment of the present disclosure arranges dominant trace segments of the at least first and second resistors with approximately the same orientation, where the dominant trace segments shall enclose an angle between zero and maximum thirty degrees. The term dominant trace segment is used for those parts of a meandering trace which are of considerable length, opposed to just the bends, and which have the highest impact on the overall resistance value of that trace compared to other trace segments. In case of a straight line, the dominant trace segment and the trace itself are the same.

Based on these basic ideas for matching the initial value, temperature stability and long term stability of the high and low ohmic resistors, these resistors may be designed in different ways in order to achieve their desired resistance values and thereby the desired voltage ratio. Examples of these possible designs and the corresponding embodiments of the present disclosure will become apparent from the appended drawings and the corresponding description.

Figure 1:
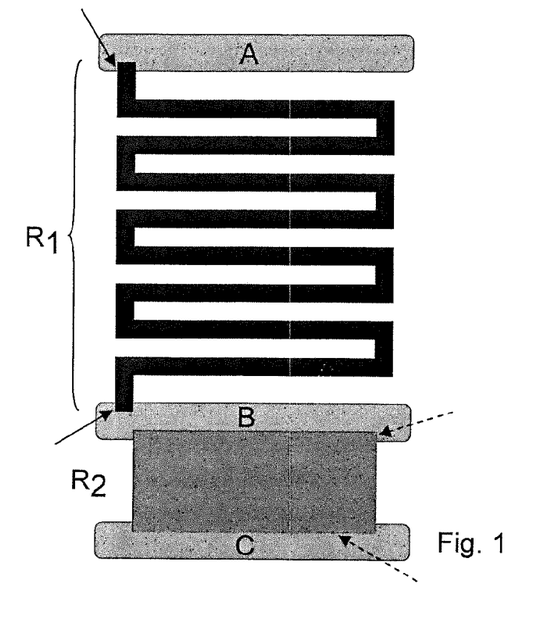
FIG. 1 shows a known resistive voltage divider with high and low ohmic resistors.

FIG. 1 illustrates a known voltage divider, where the high ohmic resistor with a resistance value $R_1$ has a long and narrow trace with multiple bends, and the low ohmic resistor with a resistance value $R_2$ has a short and wide trace. The high ohmic resistor is placed between a first contacting terminal A and a second contacting terminal B, and the low ohmic resistor is placed between the second contacting terminal B and a third contacting terminal C. The resistive film material used for the high and low ohmic resistors differs here.

Figure 2:
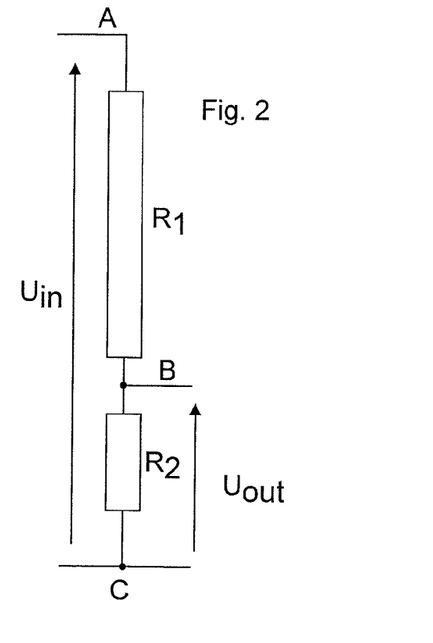
FIG. 2 shows a schematic diagram of the use of a resistive voltage divider for measurement purposes.

An equivalent schematic electrical diagram of the voltage divider of FIG. 1 is shown in FIG. 2. Such a voltage divider is, for example, used in voltage sensors for the medium voltage range between 3.6 kV and 36 kV, such as the KEVCD and KEVA sensor types by ABB. In voltage sensors, an input voltage $U_{in}$, which represents the quantity to be measured, is applied between the first and third contacting terminals A and C, and an output voltage $U_{out}$, having a much smaller value usually reduced by a factor equal to the voltage divider's ratio $(R_1+R_2)/R_2$, is then delivered to electronic circuitry in order to be processed and transformed into a measurement value.

Figure 4:
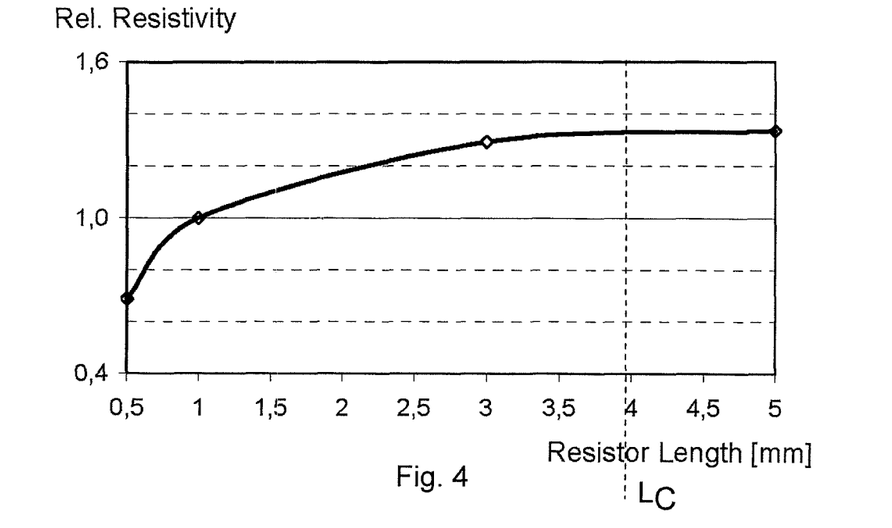
FIG. 4 shows the dependence of the relative resistivity on the resistor length for an exemplary composite material.

As can be seen from FIG. 1, the traces of both the high and the low ohmic resistors overlap partly with the corresponding contacting terminals A, B and C. Within these overlapping areas, the above-described interface effect occurs, as is indicated by the solid and dotted arrows, respectively. The interface effect can be better understood from FIG. 4, which shows the dependence of the relative resistivity on the resistor trace length for an exemplary composite material. Above the specific trace length $L_C$, the relative resistivity becomes independent of the trace length. In other words, above the specific trace length $L_C$, the individual design and further length of the resistors does not affect the resistivity any longer, thereby making it easier and more reliable to exactly define the resistance values $R_1$ and $R_2$ and thereby the ratio $(R_1+R_2)/R_2$. Accordingly, the interface effect can be matched for the high and low ohmic resistors by providing them with a trace length above the specific trace length of their resistive film material, which material is to be the same according to exemplary embodiments of the present disclosure.

Figure 5:
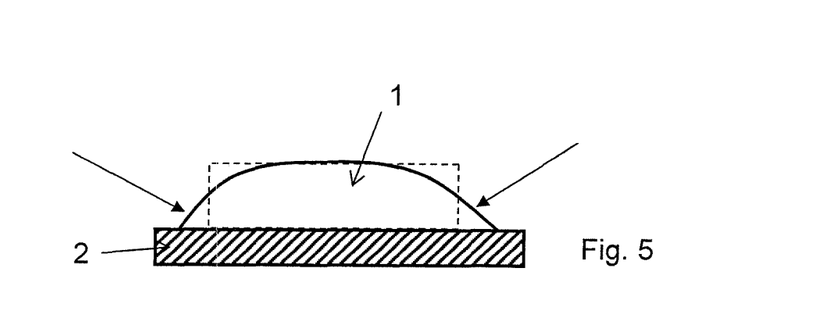
FIG. 5 shows a schematic cross-section view of a resistor trace.

In addition, the accuracy and long term stability of the ratio $(R_1+R_2)/R_2$ can be ensured in an even better way by using the same trace width. FIG. 5 shows a schematic cross-section view of a real resistor trace depicted with a solid line, compared to an ideal resistor trace shown with a dotted line. Reference symbol 1 indicates the resistive film material, and reference symbol 2 indicates the insulating substrate. The arrows indicate the areas at the edges of the trace width where the so-called edge effects occur. The size of these areas is approximately the same for all trace widths, which means that the real resistance value differs more from the ideal resistance value for smaller trace widths. In the case of FIG. 1, where the trace width of the low ohmic resistor is much larger than the trace width of the high ohmic resistor, the resistance value $R_1$ is more strongly affected by the edge effect than the resistance value $R_2$. In order to match the impact of the edge effect on the resistance values, both the high and low ohmic resistors are provided with the same trace width according to the disclosure.

Figure 3:
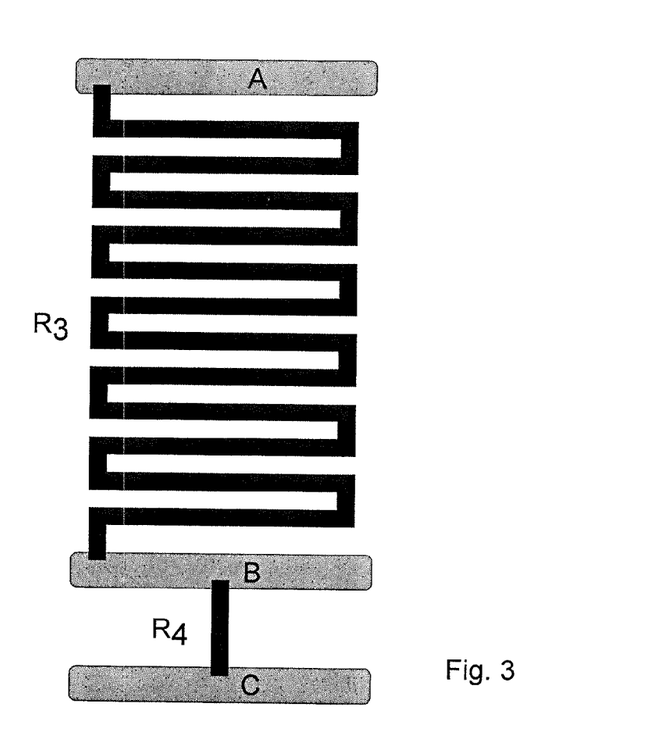
FIG. 3 shows a resistive voltage divider according to an exemplary embodiment of the present disclosure.

An exemplary embodiment of a resistive voltage divider according to the present disclosure is schematically shown in FIG. 3, where the high and low ohmic resistors are made of the same resistive film material, have a trace length above the specific trace length $L_C$ of that material of—for example—five millimeters, and have the same trace width. The trace length of the high ohmic resistor is increased as compared to the voltage divider of FIG. 1, thereby increasing its resistance value $R_3$, in order to react to the increase in the resistance value $R_4$ and to maintain the voltage ratio $(R_3+R_4)/R_4$ at approximately the same value. Since the effects on the resistivity of the high and low ohmic resistors are matched, the ratio $(R_3+R_4)/R_4$ has an improved accuracy and long term stability.

Figure 6:
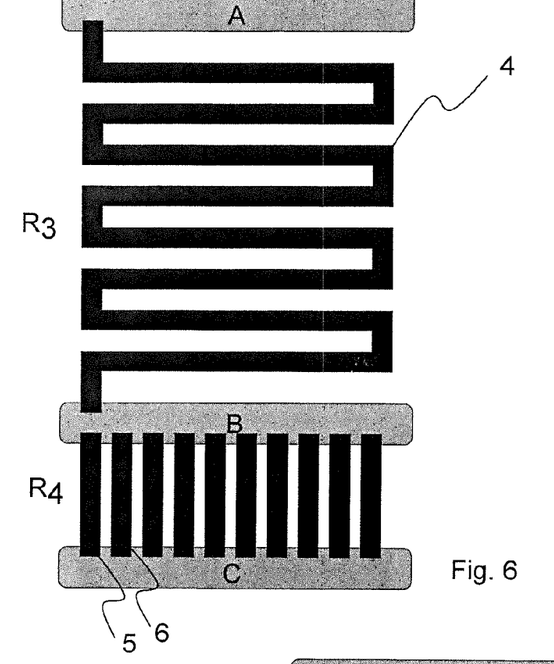
FIGS. 6 to 12 show exemplary embodiments of a resistive voltage divider according to the present disclosure.
Figure 14:
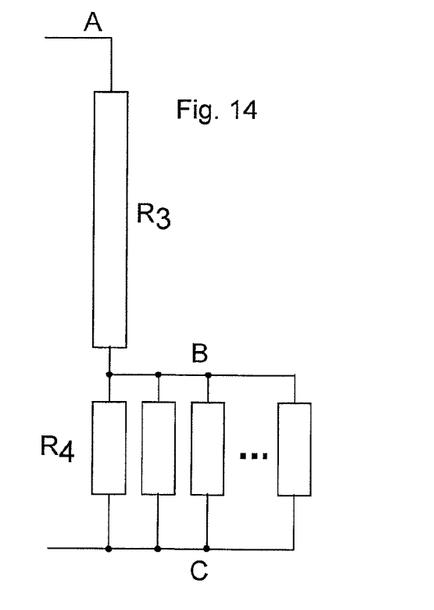
FIG. 14 shows a schematic electrical diagram for the exemplary embodiments of FIGS. 6 to 12.

The general features of the present disclosure, such as providing the same material and trace width for the high and low ohmic resistors and having their trace lengths above the specific trace length $L_C$ of that material, are present in all other embodiments described below as well. In the schematic depiction of an exemplary embodiment of the present disclosure shown in FIG. 6, it is assumed that the resistance value $R_4$ of the low ohmic resistor is maintained at the same value as in FIG. 3. In this and all other exemplary embodiments of the present disclosure, the resistance value $R_4$ of the low ohmic resistor is achieved by placing multiple straight resistor traces geometrically in parallel and connecting them electrically in parallel. In other words, the resistance value $R_4$ of the low ohmic resistor is attained by a resistor network of parallel resistors, as is depicted in FIG. 14. In FIG. 6, reference symbol 4 indicates the high ohmic resistor which is also called first resistor, and reference symbols 5 and 6 indicate the second and third resistors belonging to the parallel resistor network which is called low ohmic resistor. Altogether, ten resistors or resistor traces are arranged geometrically and electrically in parallel to form the low ohmic resistor.

Figure 7:
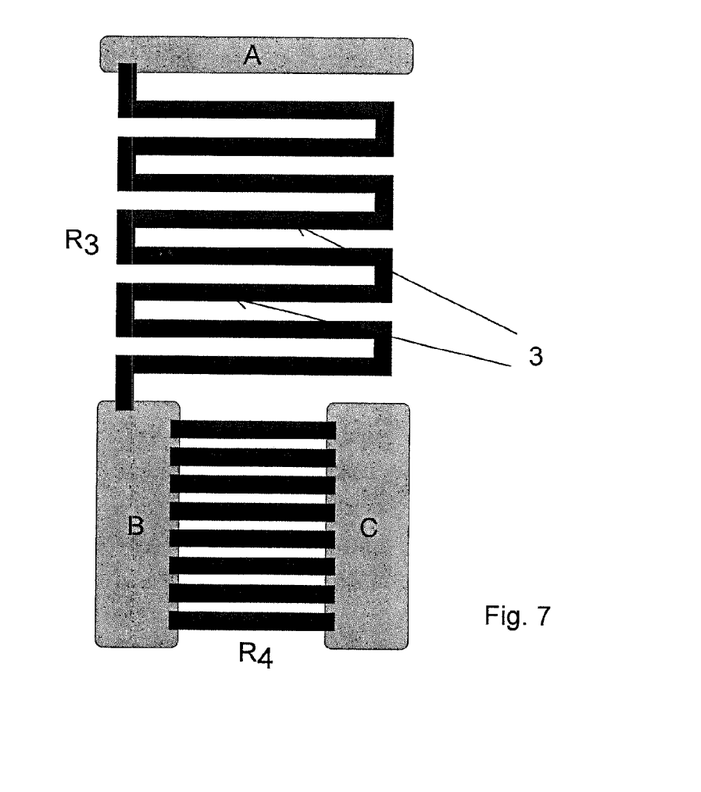

The exemplary embodiment of FIG. 7 differs from the exemplary embodiment of FIG. 6 in that, in addition, the dominant trace segments 3 of the high ohmic resistor have the same orientation as the dominant trace segments 7 of the parallel second, third and all further resistors which form the low ohmic resistor. They enclose an angle of zero degrees. For reasons of simplicity, only two of the altogether eight dominant trace segments are indicated by arrows. The alignment of the resistors orientation results in a matching of anisotropic influences on the resistivity of the traces of the high and low ohmic resistors.

The voltage divider designs of FIGS. 6 and 7 are both especially suitable for medium and high voltage applications above 5 kV, since the distance between the high voltage areas of the high ohmic resistor which are situated close to contacting terminal A have the longest distance towards the other contacting terminals B and C, thereby reducing the possibility of undesired voltage breakdowns.

Figure 8:
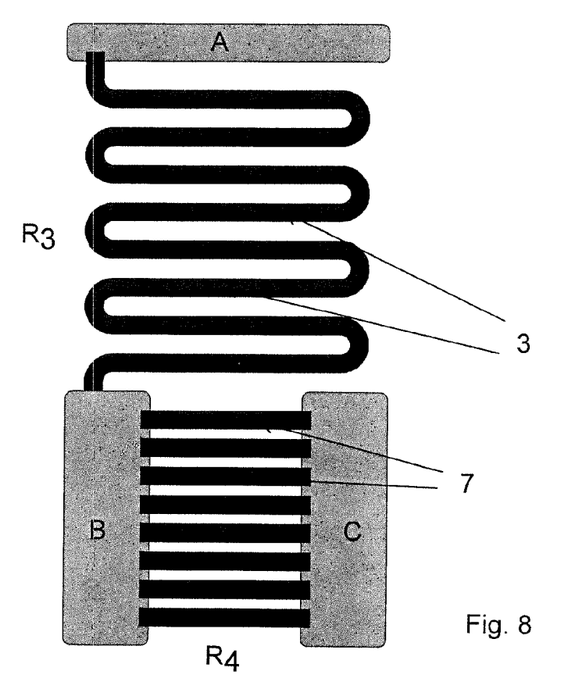
Figure 9:
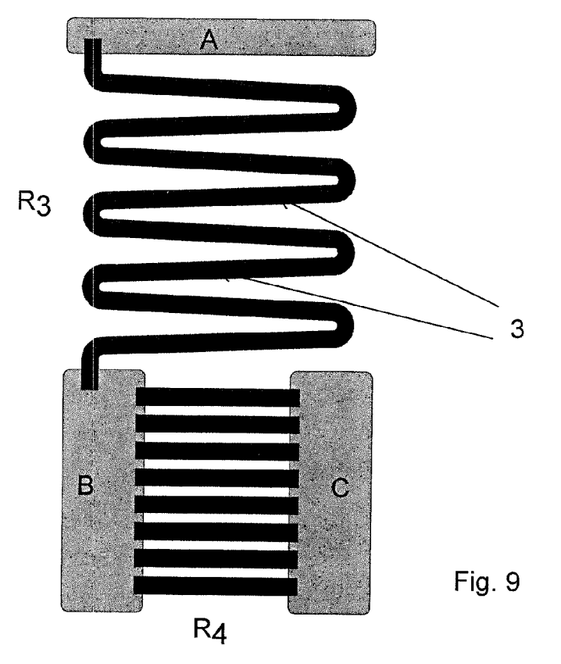

Additional exemplary embodiment are shown in FIGS. 8 and 9, where the high ohmic resistor is no longer formed as a square wave, but as a meandering form with round corners at the bends, where the dominant traces 3 of the high ohmic resistor include with the resistor traces of the low ohmic resistor an angle of zero degrees in FIG. 8 and an angle of less than thirty degrees in FIG. 9.

Figure 10:
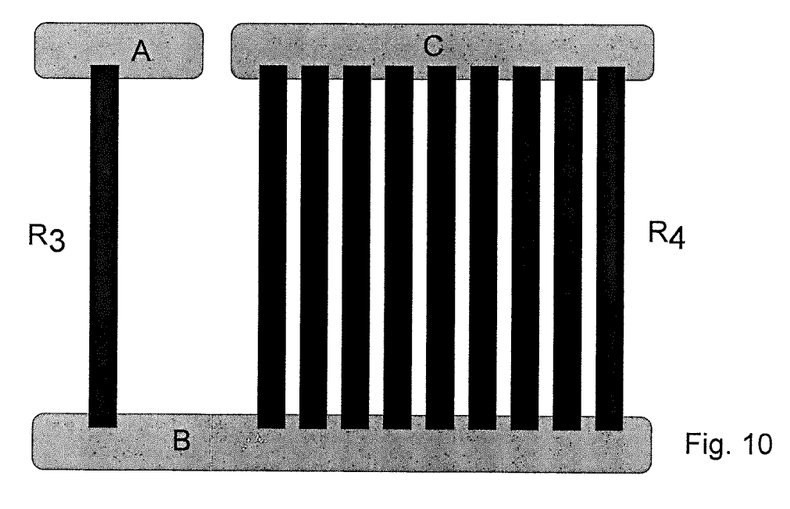
Figure 11:
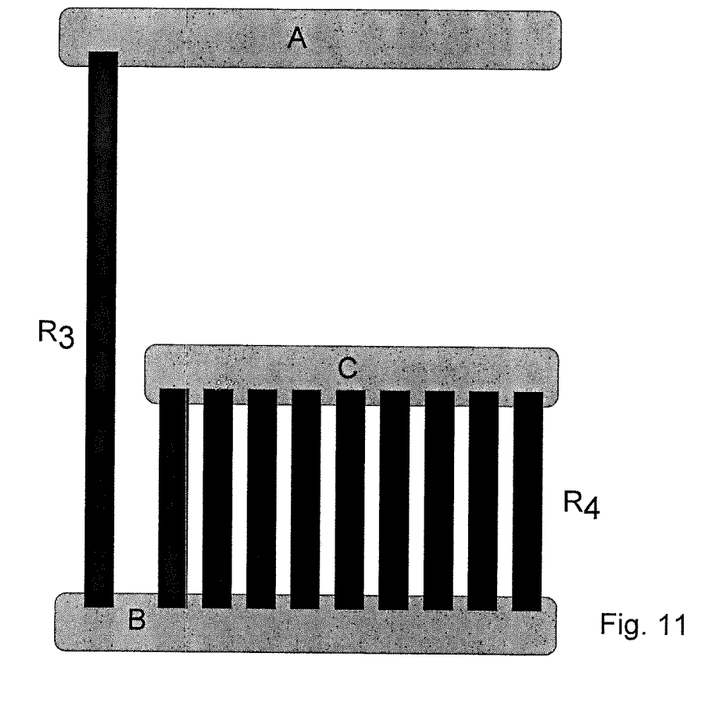
Figure 12:
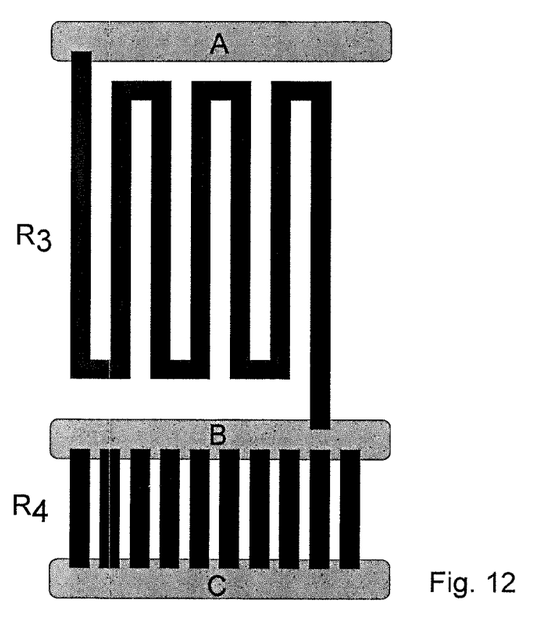

Additional exemplary embodiments where the high and low ohmic resistors have approximately the same orientation are the exemplary embodiment shown in FIG. 12 and the exemplary embodiments of FIGS. 10 and 11, respectively. These designs are more suitable for lower voltage ranges due to the shorter distances between either the high voltage areas of the high ohmic resistor and the contacting terminal B or between the high voltage contacting terminal A and the low voltage contacting terminal C (compare to FIG. 2).

The exemplary embodiment shown in FIGS. 10 and 11, respectively, show a design where the high ohmic resistor is arranged as one straight trace line. The only difference between FIGS. 10 and 11 is that in the exemplary embodiment of FIG. 10, the high ohmic resistor and the resistor traces, which form the low ohmic resistor, have exactly the same trace length, while in the sixth embodiment they have a differing trace length.

Figure 13:
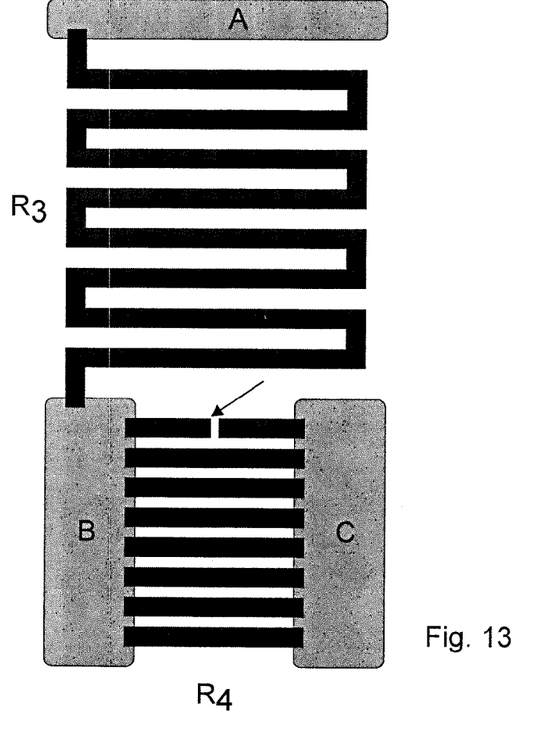
FIG. 13 exemplifies the trimming of a low ohmic resistor.

In FIG. 13, the voltage divider according to the exemplary embodiment of FIG. 7 is shown, where one of the resistor traces belonging to the low ohmic resistor is interrupted by cutting it in two pieces, as indicated by the solid arrow. In that way, one of the resistors of the corresponding parallel resistor network is eliminated, thereby increasing the resistance value $R_4$ by one increment. The adjustment of the resistance value of a resistive film resistor by erasing part of the resistive film material is known in the art as trimming. It may be noted that the design of the low ohmic resistor as a network of parallel resistor traces allows the trimming in a kind of digital manner by taking away whole resistors from the resistor network, opposed to analog trimming which is achieved by erasing the resistive film material of a resistor trace only partly, as described, for example, in U.S. Pat. No. 7,079,004. Analog trimming leaves behind cutting edges within the resistor's film material which may alter the microstructure of the material and may induce stresses, both usually affecting the stability of the resistance value. These negative effects can be avoided by applying digital trimming instead.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A resistive voltage divider having a voltage ratio between ten and one million, the resistive voltage divider comprising:
    a first resistor and a second resistor electrically connected in series, the first and second resistors being made of an electrically resistive film material and each being applied in the form of a trace onto an insulating substrate,
    wherein the first and second resistors are made of the same electrically resistive film material, have a trace length above a corresponding specific trace length and have approximately the same trace width,
    wherein the first resistor is connected between first and second contacting terminals, the first contacting terminal extending in a first direction,
    wherein the second resistor is connected between the second contacting terminal and a third contacting terminal, the second and third contacting terminals both extending in one of the first direction and a second direction, the second direction being perpendicular to the first direction, and
    wherein the second resistor is comprised of a plurality of resistor traces each correspondingly arranged in a straight line between the second and third contacting terminals.

2. The voltage divider according to claim 1, where the first and second resistors have a trace length above two millimeters.

3. The voltage divider according to claim 1, comprising:
    a third resistor electrically connected in parallel to the second resistor,
    wherein the second and third resistors are two straight trace lines which are geometrically arranged in parallel and have approximately the same trace length and approximately the same trace width.

4. The voltage divider according to claim 1, wherein the trace of the first resistor has the shape of a meandering form.

5. The voltage divider according to claim 1, wherein dominant trace segments of the first and second resistors are arranged with approximately the same orientation, and
    wherein the dominant trace segments enclose an angle between zero and thirty degrees.

6. The voltage divider according to claim 3, where the first resistor is a straight trace line arranged in parallel with the second and third resistors.

7. The voltage divider according to claim 6, where the first resistor has approximately the same trace length as the second and third resistors.

8. The voltage divider according to claim 3, where the trace of at least one of the second resistor and the third resistor is cut in two pieces for trimming purposes.

9. A voltage sensor comprising a voltage divider according to claim 1.

10. The voltage divider according to claim 2, comprising:
    a third resistor electrically connected in parallel to the second resistor,
    wherein the second and third resistors are two straight trace lines which are geometrically arranged in parallel and have approximately the same trace length and approximately the same trace width.

11. The voltage divider according to claim 10, wherein dominant trace segments of the first and second resistors are arranged with approximately the same orientation, and
    wherein the dominant trace segments enclose an angle between zero and thirty degrees.

12. The voltage divider according to claim 10, where the first resistor is a straight trace line arranged in parallel with the second and third resistors.

13. The voltage divider according to claim 12, where the first resistor has approximately the same trace length as the second and third resistors.

14. The voltage divider according to claim 13, where the trace of at least one of the second resistor and the third resistor is cut in two pieces for trimming purposes.

15. A voltage sensor comprising a voltage divider according to claim 14.

16. A voltage sensor comprising a voltage divider according to claim 3.

17. The voltage divider according to claim 2, wherein the trace of the first resistor has the shape of a meandering form.

18. The voltage divider according to claim 17, wherein dominant trace segments of the first and second resistors are arranged with approximately the same orientation, and
    wherein the dominant trace segments enclose an angle between zero and thirty degrees.

19. The voltage divider according to claim 17, comprising:
    a third resistor electrically connected in parallel to the second resistor,
    wherein the second and third resistors are two straight trace lines which are geometrically arranged in parallel and have approximately the same trace length and approximately the same trace width.

20. A voltage sensor comprising a voltage divider according to claim 19.

* * * * *